(12) United States Patent
Oda et al.

(10) Patent No.: US 9,985,136 B2
(45) Date of Patent: May 29, 2018

(54) SEMICONDUCTOR DEVICE

(71) Applicant: Toshiba Memory Corporation, Minato-ku (JP)

(72) Inventors: Minoru Oda, Yokkaichi (JP); Kiwamu Sakuma, Yokkaichi (JP); Masumi Saitoh, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/260,981

(22) Filed: Sep. 9, 2016

(65) Prior Publication Data

US 2017/0077310 A1    Mar. 16, 2017

(30) Foreign Application Priority Data

Sep. 10, 2015    (JP) ................. 2015-178803

(51) Int. Cl.
*H01L 29/786*    (2006.01)
*H01L 29/66*    (2006.01)

(52) U.S. Cl.
CPC .. *H01L 29/78609* (2013.01); *H01L 29/66757* (2013.01); *H01L 29/7866* (2013.01); *H01L 29/78696* (2013.01)

(58) Field of Classification Search
CPC ........... H01L 29/78609; H01L 29/7866; H01L 29/66757; H01L 29/78696
(Continued)

(56) References Cited

U.S. PATENT DOCUMENTS

2002/0074548 A1    6/2002   Lee et al.
2004/0065884 A1    4/2004   Bhattacharyya
(Continued)

FOREIGN PATENT DOCUMENTS

JP    2002-244153 A    8/2002
JP    2002-299348 A    10/2002
(Continued)

OTHER PUBLICATIONS

H. Tanaka, et al., "Bit Cost Scalable Technology with Punch and Plug Process for Ultra High Density Flash Memory" Symposium on VLSI Technology Digest of Technical Papers, 2007, pp. 14-15.

(Continued)

*Primary Examiner* — Bo Fan
(74) *Attorney, Agent, or Firm* — Oblon, McClelland, Maier & Neustadt, L.L.P.

(57) ABSTRACT

According to one embodiment, a semiconductor device includes first to third semiconductor regions and first to third conductors. The second semiconductor region is separated from the first semiconductor region in a first direction. The third semiconductor region is provided between the first and the second semiconductor regions. The third conductor is separated from the third semiconductor region in a second direction intersecting the first direction. The third semiconductor region includes first and second partial regions. The first partial region includes a first metal element, and is amorphous. The second partial region is stacked with the first partial region in the second direction, and is polycrystalline. A first concentration of the first metal element in the first partial region is higher than a second concentration of the first metal element in the second partial region, or the second partial region does not include the first metal element.

18 Claims, 16 Drawing Sheets

(58) Field of Classification Search
USPC .................................... 257/101, 65; 438/45
See application file for complete search history.

(56) References Cited

U.S. PATENT DOCUMENTS

| | | | | |
|---|---|---|---|---|
| 2008/0157116 | A1* | 7/2008 | Park | H01L 21/02532 257/101 |
| 2010/0330799 | A1* | 12/2010 | Hamanaka | H01L 21/7682 438/618 |
| 2014/0175583 | A1* | 6/2014 | Doyle | H01L 43/08 257/427 |
| 2014/0209897 | A1* | 7/2014 | Kubota | H01L 29/41733 257/43 |

FOREIGN PATENT DOCUMENTS

| | | |
|---|---|---|
| JP | 2002-313719 A | 10/2002 |
| JP | 2003-100629 A | 4/2003 |
| JP | 3981532 B2 | 7/2007 |
| JP | 2008-131022 A | 6/2008 |
| JP | 2014-039019 A | 2/2014 |
| JP | 2014-057056 A | 3/2014 |
| JP | 2015-038895 A | 2/2015 |

OTHER PUBLICATIONS

Chih-Chao Yang, et al., "Record-High 121/62 µA/µm On-Currents 3D Atacked Epi-Like Si FETs With and Without Metal Back Gate" IEDM13—731, 2013, pp. 29.6.1-29.6.4.

Seok-Woon Lee, et al., "Low Temperature Poly-Si Thin-Film Transistor Fabrication by Metal-Induced Lateral Crystallization" IEEE Electron Device Letters, vol. 17, No. 4, Apr. 1996, pp. 160-162.

C. J. Su, et al. "High-Performance TFTs With Si Nanowire Channels Enhanced by Metal-Induced Lateral Crystallization" IEEE Electron Device Letters, vol. 27, No. 7, Jul. 2006, pp. 582-584.

Jae Hwan Oh, et al., "Effect of Ni Thickness on Off-State Currents of Poly-Si TFTs Using Ni-Induced Lateral Crystallization of Amorphous Silicon" Electrochemical and Solid-State Letters 12, 2009, pp. J5-J7.

Horng-Chih Lin, et al., "High-Performance Poly-Si Nanowire NMOS Transistors" IEEE Transactions on Nanotechnology, vol. 6, No. 2, Mar. 2007, pp. 206-212.

* cited by examiner

US 9,985,136 B2

SEMICONDUCTOR DEVICE

CROSS-REFERENCE TO RELATED APPLICATIONS

This application is based upon and claims the benefit of priority from Japanese Patent Application No. 2015-178803, filed on Sep. 10, 2015; the entire contents of which are incorporated herein by reference.

FIELD

Embodiments described herein relate generally to a semiconductor device.

BACKGROUND

For example, polysilicon (poly-Si) is used as the channel material for three-dimensional memory called BiCS (Bit Cost Scalable) memory and as the channel material of three-dimensionally stacked circuits. It is desirable to suppress the leakage current of semiconductor devices including poly-Si.

DETAILED DESCRIPTION

Figure 1A:
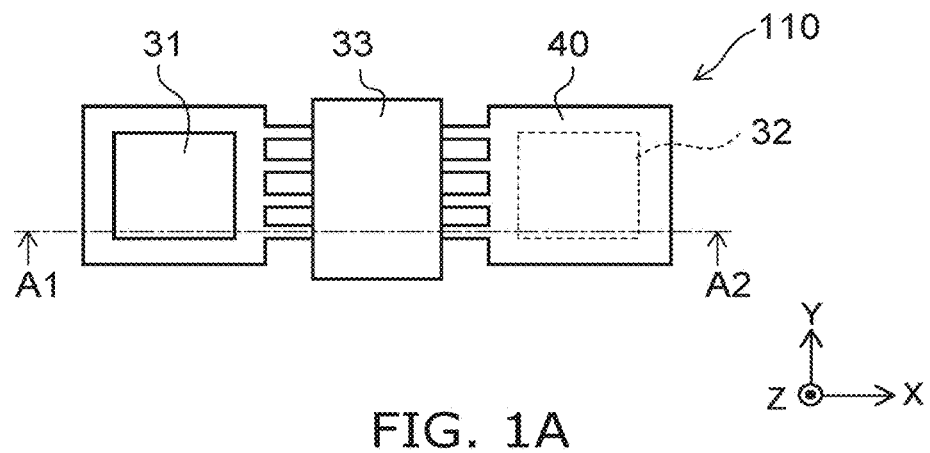
FIG. 1A and FIG. 1B are schematic views showing a semiconductor device according to a first embodiment.

According to one embodiment, a semiconductor device includes a first semiconductor region, a second semiconductor region, a third semiconductor region, a first conductor, a second conductor, and a third conductor. The second semiconductor region is separated from the first semiconductor region in a first direction. The third semiconductor region is between the first semiconductor region and the second semiconductor region. The first conductor is electrically connected to the first semiconductor region. The second conductor is electrically connected to the second semiconductor region. The third conductor is separated from the third semiconductor region in a second direction intersecting the first direction. The third semiconductor region includes a first partial region and a second partial region. The first partial region includes a first metal element. The first partial region is amorphous. The second partial region is stacked with the first partial region in the second direction. The second partial region is polycrystalline. A first concentration of the first metal element in the first partial region is higher than a second concentration of the first metal element in the second partial region, or the second partial region does not include the first metal element.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

Figure 1B:
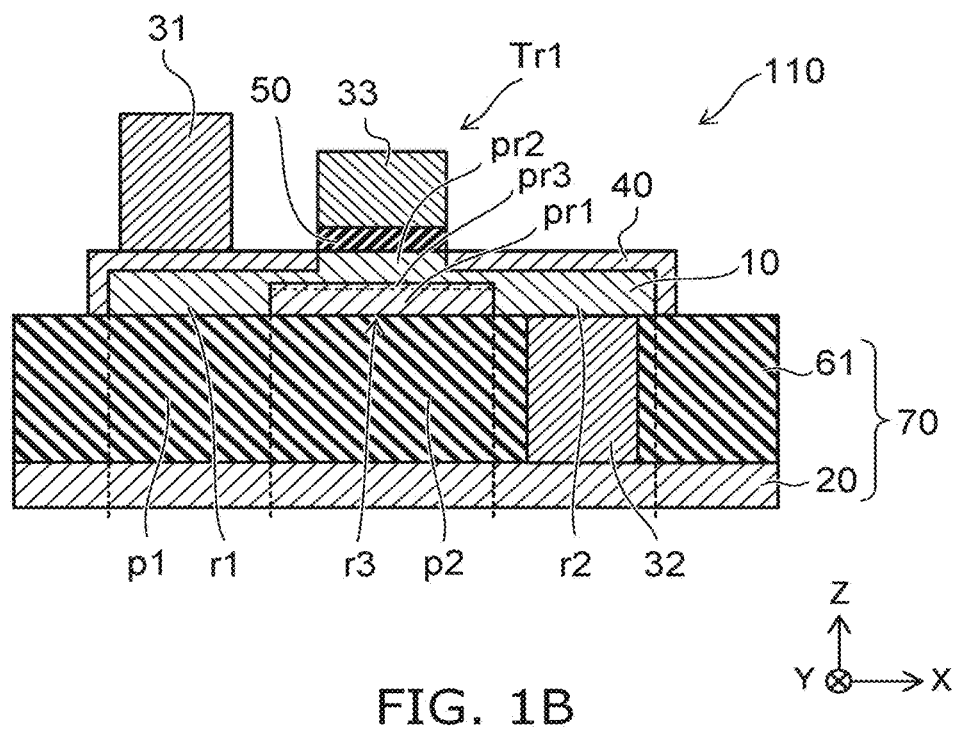

FIG. 1A and FIG. 1B are schematic views showing a semiconductor device according to a first embodiment.

FIG. 1A is a schematic top view showing the semiconductor device.

FIG. 1B is a schematic cross-sectional view showing the semiconductor device.

The semiconductor device 110 according to the embodiment includes a first semiconductor layer 10, a first conductor 31, a second conductor 32, a third conductor 33, a silicide layer 40, a gate insulating layer 50, and a substrate 70.

The substrate 70 is, for example, a substrate in which a CMOS (complementary metal-oxide-semiconductor) circuit is provided on a silicon wafer.

The first semiconductor layer 10 is provided on the substrate 70. The first semiconductor layer 10 includes a first semiconductor region r1, a second semiconductor region r2, and a third semiconductor region r3. The first semiconductor region r1 is, for example, a source region. The second semiconductor region r2 is provided to be separated in a first direction from the first semiconductor region r1. The second semiconductor region r2 is, for example, a drain region. The third semiconductor region r3 is provided between the first semiconductor region r1 and the second semiconductor region r2. The third semiconductor region r3 is, for example, a channel region. A first transistor Tr1 that includes the first to third semiconductor regions r1 to r3 is provided in the first semiconductor layer 10. For example, the first transistor Tr1 is shown as a TFT (Thin Film Transistor).

The first conductor 31 is electrically connected to the first semiconductor region r1. The first conductor 31 is, for example, a source electrode. The second conductor 32 is electrically connected to the second semiconductor region r2. The second conductor 32 is, for example, a drain electrode. The third conductor 33 is separated from the third semiconductor region r3 in a second direction intersecting the first direction. The third conductor 33 is, for example, a gate electrode. The gate insulating layer 50 is provided between the third conductor 33 and the third semiconductor region r3.

A stacking direction from the third conductor 33 toward the first semiconductor layer 10 is taken as a Z-axis direction. One direction perpendicular to the Z-axis direction is taken as an X-axis direction. A direction perpendicular to the Z-axis direction and the X-axis direction is taken as a Y-axis direction. The first direction is, for example, the X-axis direction. The second direction is, for example, the Z-axis direction.

In the embodiment, the third semiconductor region r3 includes a first partial region pr1 that is amorphous, and a second partial region pr2 that is polycrystalline. The first partial region pr1 includes a first metal element. The second partial region pr2 is stacked with the first partial region pr1 in the Z-axis direction. For example, the second partial region pr2 is provided between the first partial region pr1 and the third conductor 33. The third semiconductor region r3 includes at least one of silicon (Si) or germanium. The first partial region pr1 includes, for example, amorphous silicon (a-Si). The second partial region pr2 includes, for example, polysilicon (poly-Si). The first semiconductor region r1 includes a polycrystal of at least one of silicon or germanium. The first semiconductor region r1 includes, for example, poly-Si. The second semiconductor region r2 includes a polycrystal of at least one of silicon or germanium. The second semiconductor region r2 includes, for example, poly-Si.

A first concentration of the first metal element in the first partial region pr1 is higher than a second concentration of the first metal element in the second partial region pr2; or the second partial region pr2 does not include the first metal element. The first metal element includes, for example, at least one selected from the group consisting of tungsten (W), cobalt (Co), titanium (Ti), nickel (Ni), palladium (Pd), platinum (Pt), aluminum (Al), and copper (Cu).

For example, a-Si and poly-Si can be discriminated using TEM (Transmission Electron Microscopy), electron diffraction, etc. For TEM, it is possible to confirm a polycrystalline or amorphous state by acquiring a high-resolution TEM image of the location of interest and confirming the existence or absence of a crystal lattice at the location. Or, it is possible to confirm the polycrystalline or amorphous state by acquiring an electron diffraction image of the location of interest and confirming the existence or absence and strength of a diffraction point.

In other words, in the embodiment, the first partial region pr1 that is positioned on the lower portion side of the third semiconductor region r3 used as the channel layer is made amorphous (amorphized). Residual metal that is due to MILC (Metal Induced Lateral Crystallization) is trapped in the first partial region pr1. By amorphizing the first partial region pr1, higher resistance is possible; and conduction due to the effects of the residual metal can be suppressed. Thereby, leakage current that is caused by the residual metal can be suppressed.

In poly-Si, carriers are trapped and scattered by the grain boundaries and the intragranular defects existing inside the channel layer. Therefore, compared to monocrystalline Si, the mobility is lower; the S-factor is higher; and threshold shift occurs. To suppress these problems, it is favorable to suppress the number of grain boundaries inside the channel layer to be low; and to this end, it is desirable to increase the particle size of the poly-Si.

SPC (Solid Phase Crystallization) that obtains a poly-Si layer by forming an a-Si layer and crystallizing the a-Si layer by subsequently performing heat treatment is generally used as technology for forming the poly-Si layer. MILC is used as a method for further increasing the particle size. In MILC, crystallization of the a-Si layer is implemented from a seed crystal region where a silicide is formed. At this time, the metal (Ni or the like) remains inside the channel layer. It is known experimentally that the metal remains easily particularly at the interface vicinity between the semiconductor and the insulating film. The metal provides a trap level inside the bandgap and causes the leakage current to increase. The metal causes the mobility to decrease.

There is a reference example in which the metal remaining inside the channel layer is removed by gettering. In the case of the reference example, it is particularly difficult to remove the residual metal trapped in the lower interface vicinity of the poly-Si.

Conversely, in the structure of the embodiment, the first partial region pr1 that is positioned on the lower portion side of the third semiconductor region r3 used as the channel layer is amorphized. That is, the lower interface vicinity of the channel layer is amorphized. By amorphizing the first partial region pr1, the resistance is increased; and the conduction due to the residual metal trapped in the lower interface vicinity of the channel layer can be suppressed. Thereby, the leakage current caused by the residual metal can be suppressed.

As shown in FIG. 1A and FIG. 1B, the first partial region pr1 is continuous with the second partial region pr2. The third semiconductor region r3 may further include a third partial region pr3. The third partial region pr3 is provided between the first partial region pr1 and the second partial region pr2. The third concentration of the first metal element in the third partial region pr3 is between the first concentration and the second concentration.

The substrate 70 includes a second semiconductor layer (a semiconductor layer) 20 and a first insulating layer 61. The second semiconductor layer 20 is provided to be separated from the first semiconductor layer 10 in the Z-axis direction. The second semiconductor layer 20 includes, for example, silicon, etc. The first insulating layer 61 is provided between the first semiconductor layer 10 and the second semiconductor layer 20. The first insulating layer 61 includes, for example, silicon oxide, silicon nitride, silicon oxynitride, etc.

In other words, the third semiconductor region r3 is disposed between the third conductor 33 and the second semiconductor layer 20 in the Z-axis direction. The first insulating layer 61 includes a first portion p1 and a second portion p2. The first portion p1 of the first insulating layer 61 is disposed between the first semiconductor region r1 and a portion of the second semiconductor layer 20. The second portion p2 of the first insulating layer 61 is disposed between the third semiconductor region r3 and a portion of the second semiconductor layer 20.

In the embodiment, the second conductor 32 is provided between the second semiconductor region r2 and the second semiconductor layer 20. The second conductor 32 is electrically connected to the second semiconductor layer 20. The first semiconductor region r1 is disposed between the first conductor 31 and the first insulating layer 61. That is, the first conductor 31 (the source electrode) is positioned on the upper side of the first semiconductor layer 10; and the second conductor 32 (the drain electrode) is positioned on the lower side of the first semiconductor layer 10.

The arrangement may be the reverse of that recited above. That is, the first conductor 31 (the source electrode) may be positioned on the lower side of the first semiconductor layer 10; and the second conductor 32 (the drain electrode) may be positioned on the upper side of the first semiconductor layer 10. Both the first conductor 31 and the second conductor 32 may be provided on the upper side of the first semiconductor layer 10. Both the first conductor 31 and the second conductor 32 may be provided on the lower side of the first semiconductor layer 10.

The silicide layer 40 is provided on the first semiconductor region r1 (the source region) and the second semiconductor region r2 (the drain region) of the first semiconductor layer 10. The silicide layer 40 includes, for example, NiSi, etc.

FIG. 2A, FIG. 2B, FIG. 3A, FIG. 3B, FIG. 4A, FIG. 4B, FIG. 5A, FIG. 5B, FIG. 6A, FIG. 6B, FIG. 7A, FIG. 7B, FIG. 8A, FIG. 8B, FIG. 9A, FIG. 9B, FIG. 10A, and FIG. 10B are schematic views in order of the processes, showing a method for manufacturing the semiconductor device according to the first embodiment.

FIG. 2A to FIG. 10A are schematic cross-sectional views in order of the processes, showing the method for manufacturing the semiconductor device according to the first embodiment.

FIG. 2B to FIG. 10B are schematic top views in order of the processes, showing the method for manufacturing the semiconductor device according to the first embodiment.

Figure 11:
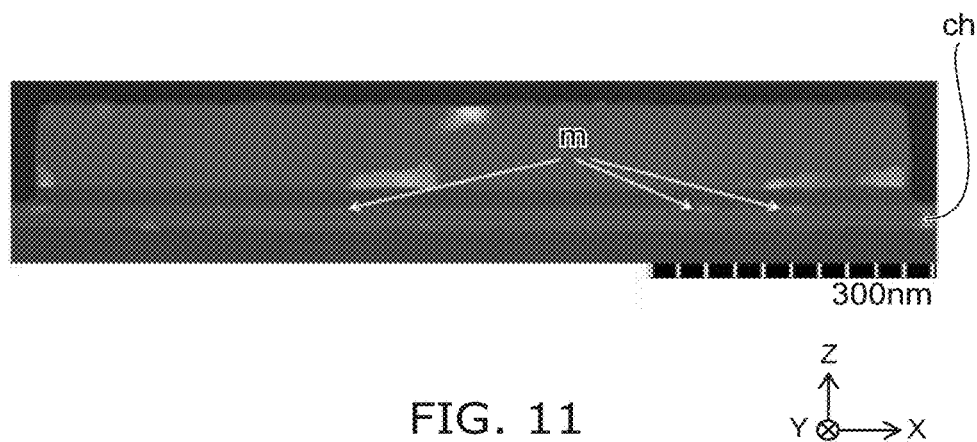
FIG. 11 is a photograph showing the state of the metal trapped in the interface vicinity of the channel layer.

FIG. 11 is a photograph showing the state of the metal trapped in the interface vicinity of the channel layer.

Figures 12A, 12B, 12C:
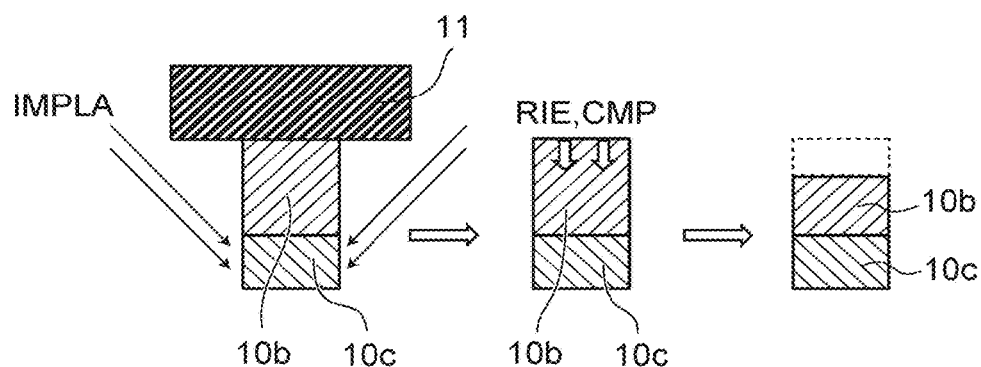
FIG. 12A to FIG. 12C are schematic views showing an amorphization method of the channel layer lower portion.

FIG. 12A to FIG. 12C are schematic views showing an amorphization method of the channel layer lower portion.

Figure 2A:
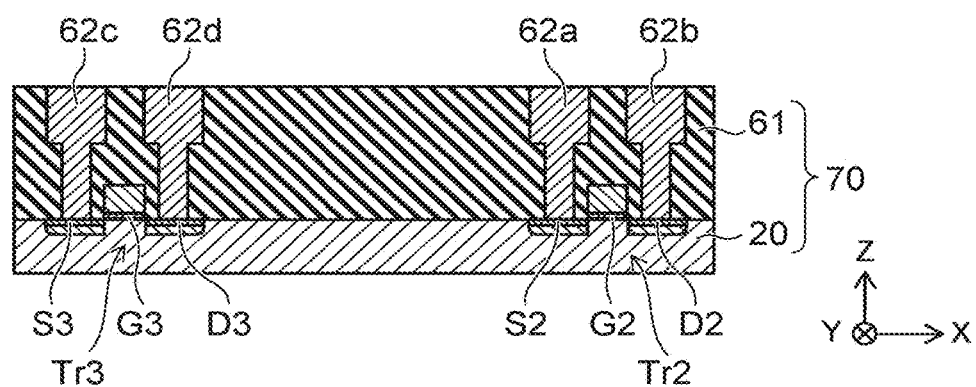
FIG. 2A and FIG. 2B are schematic views in order of the processes, showing a method for manufacturing the semiconductor device according to the first embodiment.
Figure 2B:
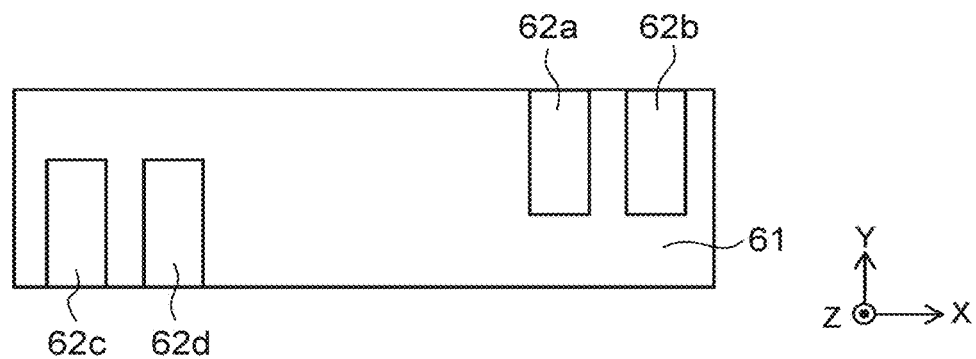

As shown in FIG. 2A and FIG. 2B, the substrate 70, in which the CMOS circuit is formed on the Si wafer, is prepared. The substrate 70 includes the second semiconductor layer 20 and the first insulating layer 61. A second transistor Tr2 and a third transistor Tr3 are formed in the second semiconductor layer 20. The second transistor Tr2 includes a source region S2, a gate region G2, and a drain region D2. The third transistor Tr3 includes a source region S3, a gate region G3, and a drain region D3.

For example, four interconnects (interconnect layers) 62a to 62d are formed in the first insulating layer 61. The interconnect 62a is electrically connected to the source region S2. The interconnect 62b is electrically connected to the drain region D2. The interconnect 62c is electrically connected to the source region S3. The interconnect 62d is electrically connected to the drain region D3.

The embodiment includes a process of amorphizing only the polycrystalline semiconductor layer corresponding to the first partial region pr1 (the channel layer lower portion) of FIG. 1B after performing the MILC processing. It is desirable to select, as the first insulating layer 61, a film in which it is easy to trap the metal in the interface vicinity of the amorphous semiconductor layer after the amorphization. The first insulating layer 61 includes, for example, a $SiO_2$ film having a sparse density, a $SiO_2$ film damaged by plasma or the like, a SiN film, etc.

In the embodiment, each of the interconnects 62a to 62d includes multiple layers. Each of the interconnects 62a to 62d may include only one layer.

Figure 3A:
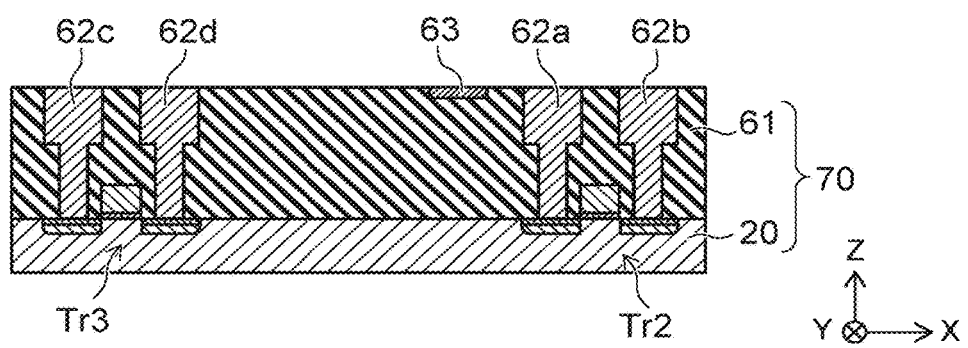
FIG. 3A and FIG. 3B are schematic views in order of the processes, showing a method for manufacturing the semiconductor device according to the first embodiment.
Figure 3B:
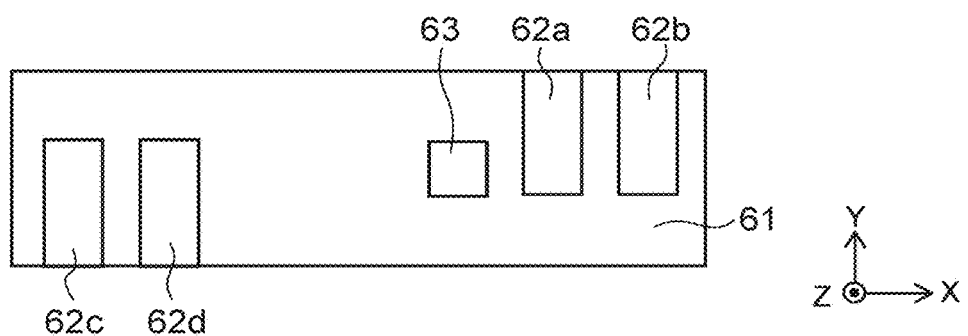

Then, as shown in FIG. 3A and FIG. 3B, a metal region (a metal layer) 63 is formed on the first insulating layer 61 using MILC. For example, photolithography, RIE (Reactive Ion Etching), metal film formation, CMP (Chemical Mechanical Polishing) processing, etc., are used to form the metal region 63.

Figure 4A:
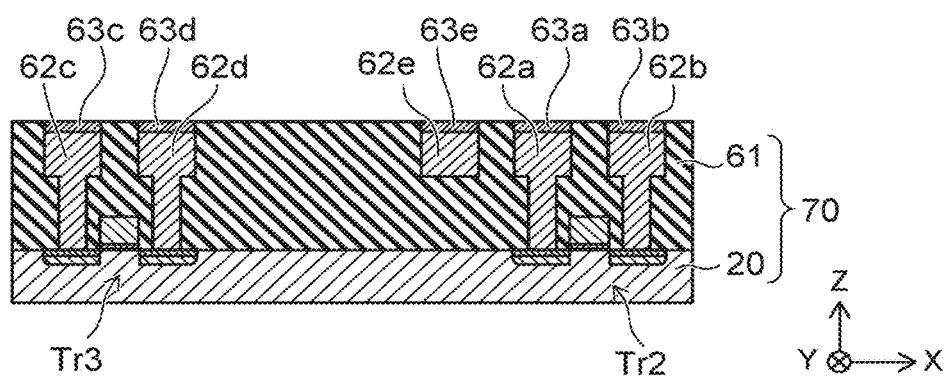
FIG. 4A and FIG. 4B are schematic views in order of the processes, showing a method for manufacturing the semiconductor device according to the first embodiment.
Figure 4B:
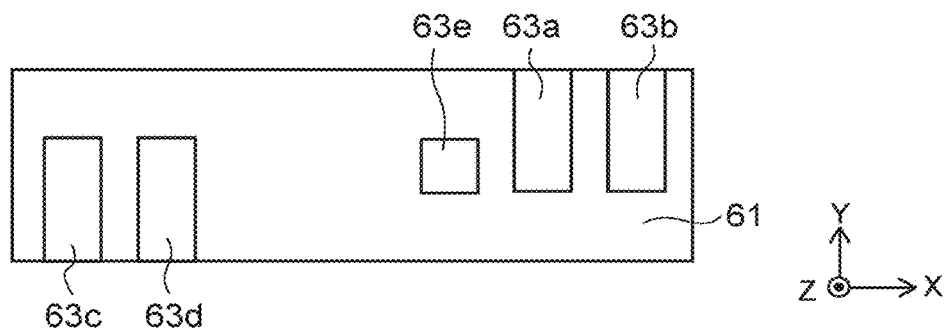

As shown in FIG. 4A and FIG. 4B, the metal region 63 recited above may be formed simultaneously when forming the interconnects 62a to 62d of the CMOS circuit. In other words, an interconnect 62e that is not electrically connected to the second semiconductor layer 20 is formed simultaneously with the interconnects 62a to 62d. Then, metal regions 63a to 63d are formed respectively on the uppermost layers of the interconnects 62a to 62d; and a metal region 63e is formed on the uppermost layer of the interconnect 62e.

Thereby, it is possible to reduce the number of processes necessary to form the metal region 63. It is favorable for the material of the metal region 63 to be a metal that can form a silicide. The metal region 63 includes, for example, at least one selected from the group consisting of tungsten (W), cobalt (Co), titanium (Ti), nickel (Ni), palladium (Pd), platinum (Pt), aluminum (Al), and copper (Cu).

The interconnects 62a to 62d and the interconnect 62e may include a metal such as W, Al, Cu, or the like, an alloy including such a metal, Si, and Ni, Ti, Pd, or Pt, an organic material such as graphene, CNT, etc.

Figure 5A:
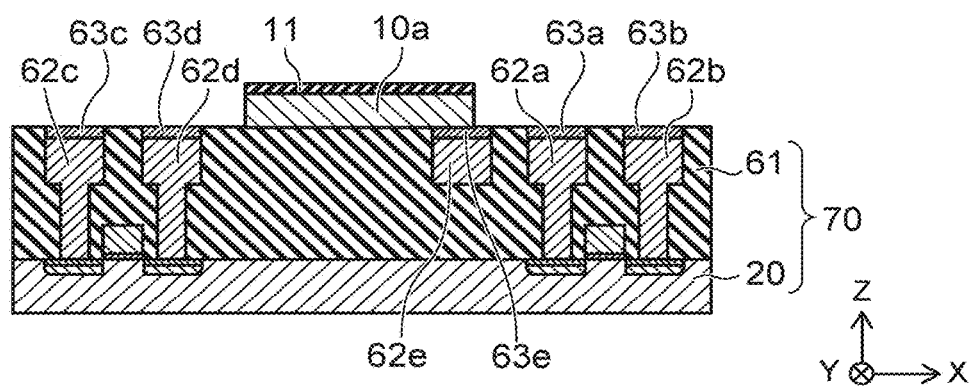
FIG. 5A and FIG. 5B are schematic views in order of the processes, showing a method for manufacturing the semiconductor device according to the first embodiment.
Figure 5B:
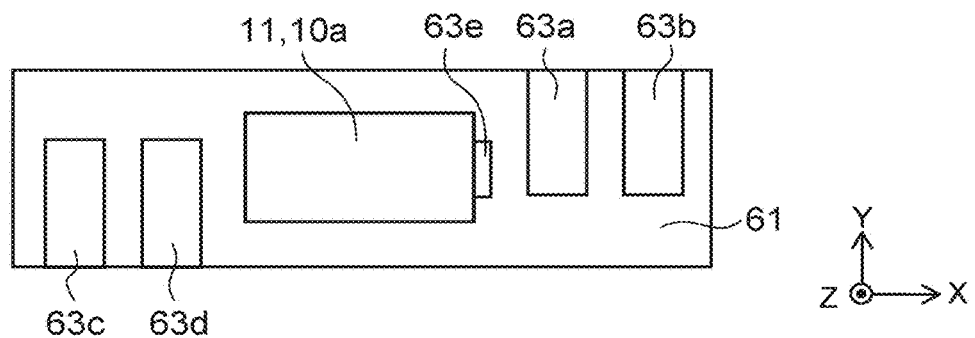

Then, as shown in FIG. 5A and FIG. 5B, an amorphous semiconductor layer 10a and a hard mask layer 11 are formed on the first insulating layer 61 where the metal region 63e is formed. For example, Si, germanium (Ge), etc., may be used as the amorphous semiconductor layer 10a. For example, a compound semiconductor such as $Si_{1-x}Ge_x$ (0<x<1), $Ge_{1-z}Sn_z$ (0<z<1), $Si_{1-a-b}Ge_aSn_b$ (0<a, 0<b, and 1−a−b<1), GaAs, InAs, $In_cGa_{1-c}As$ (0<c<1), GaSb, InSb, $In_dGa_{1-d}Sb$ (0<d<1), etc., may be used as the amorphous semiconductor layer 10a.

An example in which a-Si is used as the amorphous semiconductor layer 10a will now be described. The material of the amorphous semiconductor layer 10a is not limited thereto. From the perspective of the device characteristics and the crystallinity improvement of the poly-Si layer after the crystallization, it is favorable for the thickness of the amorphous semiconductor layer 10a to be 50 nanometers (nm) or less, and particularly 30 nm or less. However, the thickness may be 50 nm or more according to the thickness of the layer of the channel lower portion amorphized in a subsequent process.

Figure 6A:
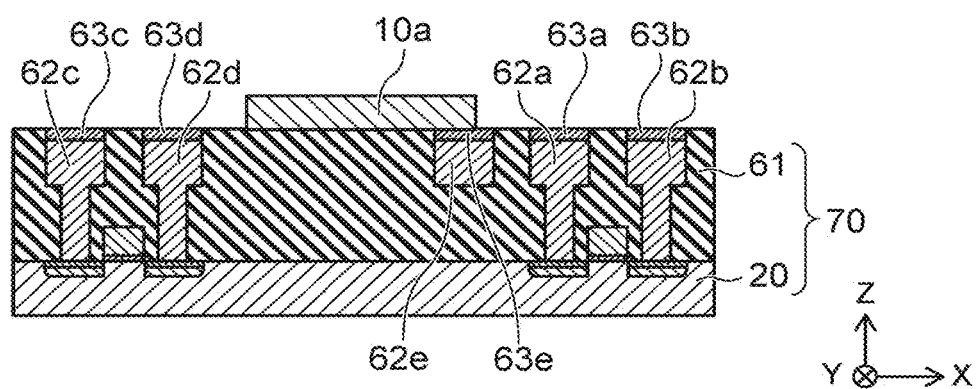
FIG. 6A and FIG. 6B are schematic views in order of the processes, showing a method for manufacturing the semiconductor device according to the first embodiment.
Figure 6B:
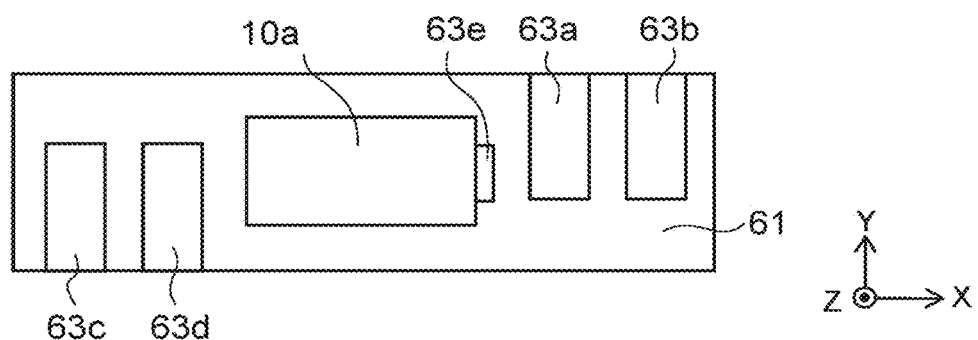

The hard mask layer 11 includes a material for which selective RIE with the poly-Si after the crystallization is possible. It is favorable for the material of the hard mask layer 11 to be able to suppress the implantation of the element into the channel surface when the element is ion-implanted obliquely in a subsequent process. For example, $SiO_2$, SiN, a high-K film such as an $Al_2O_3$ film, a $HfO_2$ film, etc., may be used as the hard mask layer 11. In the case where the amorphization process of the channel lower portion is not performed in a subsequent process, the hard mask layer 11 may not be formed as shown in FIG. 6A and FIG. 6B.

Figure 7A:
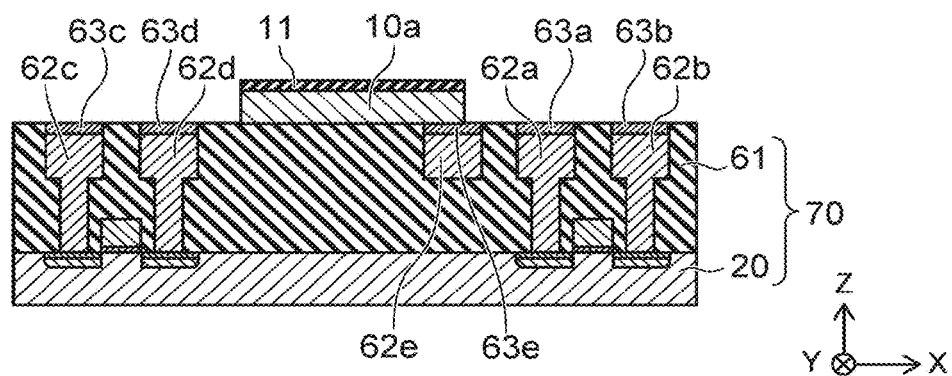
FIG. 7A and FIG. 7B are schematic views in order of the processes, showing a method for manufacturing the semiconductor device according to the first embodiment.
Figure 7B:
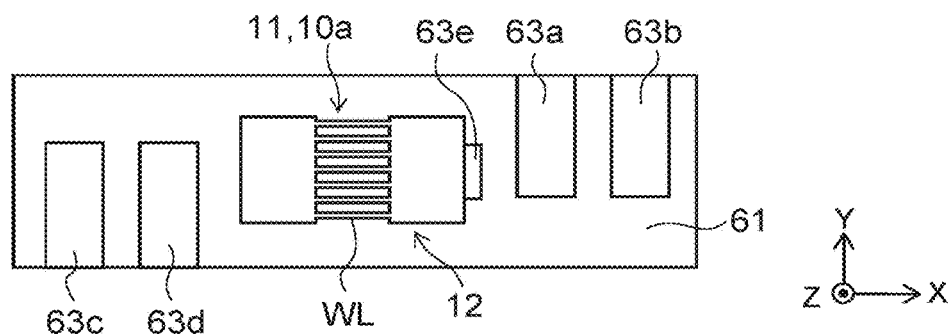

Then, as shown in FIG. 7A and FIG. 7B, wire structure portions WL are formed by patterning the amorphous semiconductor layer 10a into a wire configuration. For example, photolithography, RIE, or the like is used to form the wire structure portions WL. By patterning the amorphous semiconductor layer 10a into the wire configuration, the third semiconductor region r3 includes multiple structure portions (the wire structure portions WL). The multiple wire structure portions WL extend in the first direction (in the example, the X-axis direction) and are separated from each other in the third direction (a direction intersecting the first direction and the second direction, i.e., the Y-axis direction in the example).

The reason for forming the wire structure portions WL is to improve the crystallinity in the MILC process. The reason for forming the wire structure portions WL is to amorphize the poly-Si layer of the channel lower portion described below by ion implantation. It is favorable for the width of the wire structure portion WL to be, for example, 100 nm or less, and particularly 50 nm or less.

In an active region 12 that includes the wire structure portions WL, a portion of the source region or a portion of the drain region is formed at a position overlapping the metal region 63e in the Z-axis direction. In the active region 12, the entire source region or the entire drain region may be formed at a position overlapping the metal region 63e in the Z-axis direction.

It is favorable for the wire structure portions WL that are used as the channel to be formed not to overlap the metal region 63e in the Z-axis direction. Thereby, the MILC is caused to occur from the source region or the drain region which is wide; and necking is caused to occur in the constricted region of the end portions of the wire structure portions WL. However, in the case where fluctuation improvement is given priority over crystallinity improvement, a portion of the wire structure portions WL may overlap the metal region 63e. However, it is favorable for the metal region 63e not to be disposed directly under the gate stack structure (the channel).

Figure 8A:
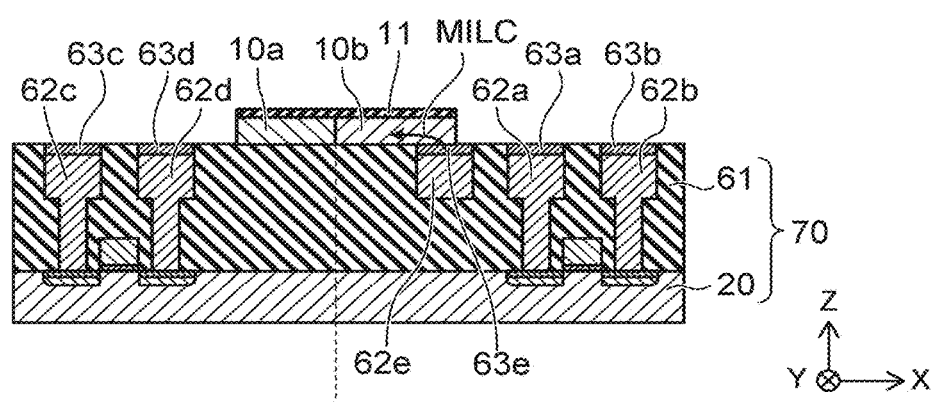
FIG. 8A and FIG. 8B are schematic views in order of the processes, showing a method for manufacturing the semiconductor device according to the first embodiment.
Figure 8B:
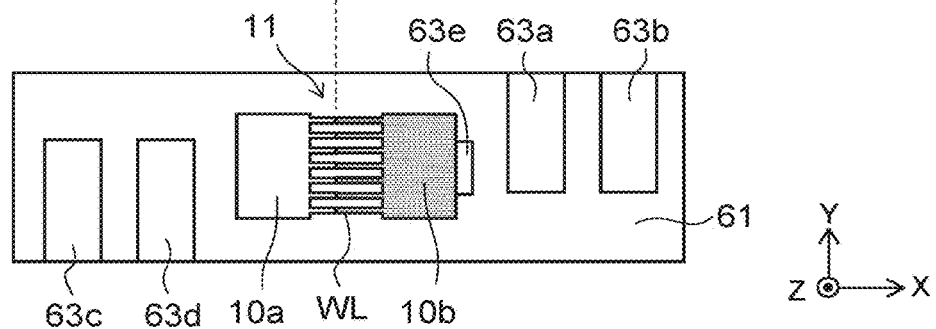

Then, as shown in FIG. 8A and FIG. 8B, heat treatment of the substrate 70 is performed. Thereby, the metal region 63e and the amorphous semiconductor layer 10a are caused to react; the MILC is caused to progress by using, as a crystal nucleus, the silicide layer formed by the reaction; and a polycrystalline semiconductor layer 10b is obtained.

Thus, by causing the MILC to progress from only one side of the source region or the drain region, the crystallinity can be improved without providing an extra seed crystal region. From the perspective of suppressing the fluctuation due to insufficient MILC crystallization, the metal region 63e that is used as the crystal nucleus may be provided on two sides, i.e., the source region and the drain region.

While the temperature when causing the MILC to progress is dependent also on the metal used to form the silicide layer, it is favorable for the temperature to be as low as possible within the temperature range in which it is possible to sufficiently crystallize the necessary gate length. This is because it is favorable for the MILC to be performed at a low temperature from the perspective of improving the crystallinity and suppressing metal contamination due to the metal diffusion from the metal supply layer. For example, in the case where Ni is used as the metal region 63e, it is favorable for the temperature of the MILC to be 530° C. or less to crystallize a gate length of 5 micrometers (μm). It is favorable for the annealing time to be 4 hours or more.

The metal (here, Ni) that diffuses or remains in the MILC process exists inside the film of the polycrystalline semiconductor layer 10b formed by the MILC. For example, it is known experimentally that the metal remains easily at the vicinity of the interface with the first insulating layer 61 and at the vicinity of the interface with the hard mask layer 11. The example of FIG. 11 shows the state of a metal m trapped in the interface vicinity of a channel layer ch. The channel layer ch corresponds to a portion of the first semiconductor layer 10.

Here, as shown in FIG. 12A, an amorphous semiconductor layer 10c is obtained by amorphizing only the lower portion of the polycrystalline semiconductor layer 10b of the wire structure portions WL by performing ion implantation IMPLA obliquely using the hard mask layer 11 as a protective film. Thereby, the effects on the off-leakage due to the residual metal are suppressed. As the ion implantation element, it is favorable to use the same element as the polycrystalline semiconductor layer 10b. An element that is in the same group of the periodic table and has a large atomic number may be used as the ion implantation element. In the case of poly-Si, it is possible to use Si, Ge, etc. Further, Ar, Ne, C, F, etc., may be implanted simultaneously to obstruct recrystallization after the amorphization. For example, it is favorable to implant these elements with a density of $10^{21}$ $cm^{-2}$ or more.

As shown in FIG. 12B and FIG. 12C, the metal that remains directly under the hard mask layer 11 on the front surface side of the polycrystalline semiconductor layer 10b also is removed. To this end, RIE processing and CMP processing of the front surface of the polycrystalline semiconductor layer 10b are performed. Thus, the first partial region pr1 and the second partial region pr2 of the third semiconductor region r3 are formed.

Figure 9A:
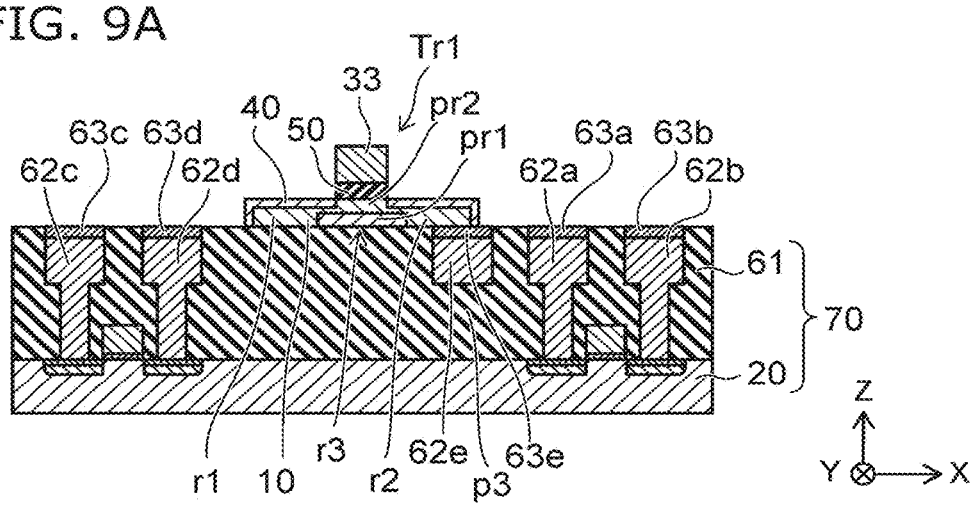
FIG. 9A and FIG. 9B are schematic views in order of the processes, showing a method for manufacturing the semiconductor device according to the first embodiment.
Figure 9B:
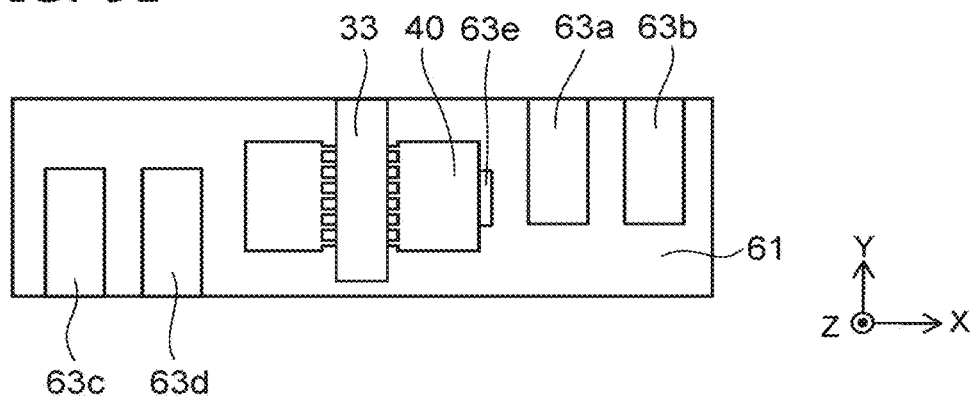

Then, as shown in FIG. 9A and FIG. 9B, after amorphizing the lower portion of the wire structure portions WL, a gate stack structure (the gate insulating layer 50 and the third conductor 33) is formed; and an N⁺ diffusion layer (not shown) and the silicide layer 40 are formed by a self-aligning process. Thus, the first transistor Tr1 (the poly-Si TFT) that is stacked on the interconnect layer is obtained.

The semiconductor device 110 includes the metal region 63e and the interconnects 62a to 62e. The metal region 63e includes the first metal element (here, Ni). The metal region 63e is stacked with at least a portion of the second semiconductor region r2 in the Z-axis direction. At least a portion of the five interconnects 62a to 62e (e.g., the interconnect 62e) is disposed between the metal region 63e and the second semiconductor layer 20. The interconnect 62e is electrically connected to the metal region 63e. The first insulating layer 61 includes a third portion p3. The third portion p3 is disposed between the second semiconductor layer 20 and the interconnect 62e. The interconnect 62e is not electrically connected to the second semiconductor layer 20. The interconnects 62a to 62d are electrically connected to the second semiconductor layer 20. The interconnects 62a to 62d are electrically insulated from the metal region 63e. The metal region 63e (and the interconnect 62e) and the interconnects 62a to 62d do not overlap in the Z-axis direction.

Figure 10A:
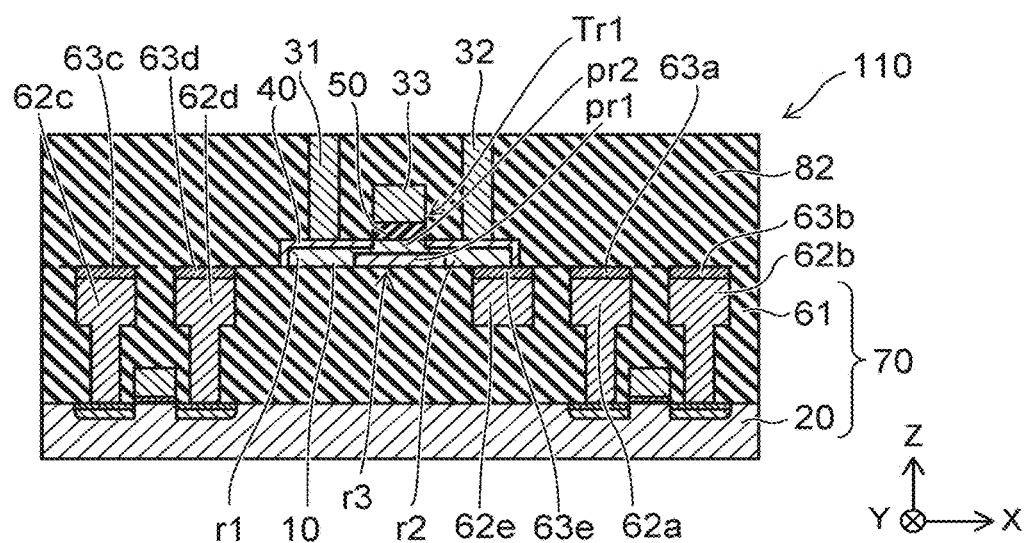
FIG. 10A and FIG. 10B are schematic views in order of the processes, showing a method for manufacturing the semiconductor device according to the first embodiment.
Figure 10B:
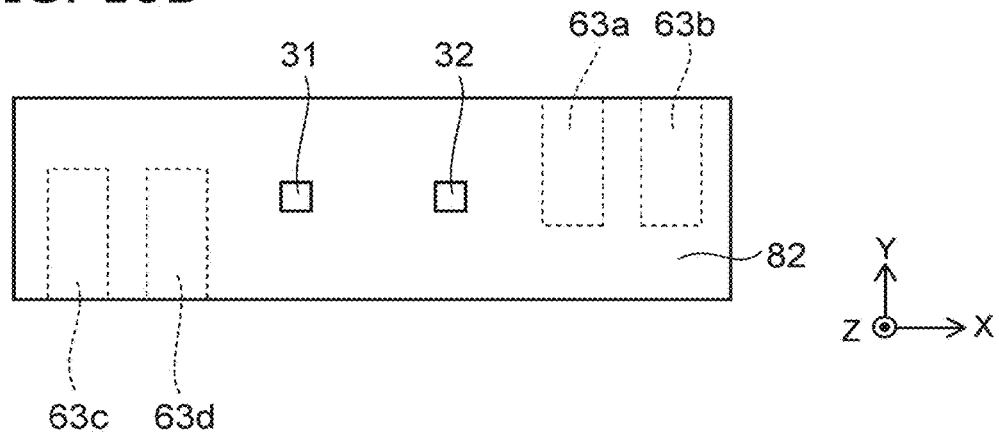

As shown in FIG. 10A and FIG. 10B, a second insulating layer 82 of $SiO_2$, SiN, or the like is formed on the first transistor Tr1; and planarizing is performed by CMP processing. In other words, the third conductor 33 is disposed between the third semiconductor region r3 and the second insulating layer 82. Then, the upper interconnect layers and the contact interconnects for the first semiconductor region r1 (the source region) and the second semiconductor region r2 (the drain region) of the first transistor Tr1 are formed;

and the first conductor 31 and the second conductor 32 are formed. Thereby, the semiconductor device 110 is obtained. For example, a portion of the second semiconductor region r2 is positioned between the metal region 63e and the second conductor 32.

Thus, it is possible to form, on a CMOS circuit, a stacked TFT structure in which poly-Si having good crystallinity is used as the channel material.

Thus, in the embodiment, the first partial region pr1 that is positioned on the lower portion side of the third semiconductor region r3 used as the channel layer is amorphized. That is, the lower interface vicinity of the channel layer is amorphized. The conduction due to the residual metal trapped in the lower interface vicinity of the channel layer can be suppressed by amorphizing the first partial region pr1. Thereby, the leakage current that is caused by the residual metal can be suppressed.

In the embodiment, a metal region that is provided separately from the interconnects connected to the transistor inside the substrate is used as a seed layer; and a MILC process is implemented after patterning the channel region into a wire configuration. At this time, the entire polycrystalline semiconductor layer including the channel layer is crystallized from one of the source region or the drain region. Thereby, it is possible to form a polycrystalline semiconductor layer having high mobility and good crystallinity. Then, only the channel lower portion region is amorphized using an oblique ion implantation process, etc. Thereby, the conduction due to the residual metal existing in the channel lower portion region is suppressed; and it is possible to suppress the leakage current.

When forming the stacked TFT structure recited above, there exists a process upper limit temperature that is determined from the following two considerations. The first consideration is the allowable temperature of the device formed in a layer under the TFT; and the second consideration is the recrystallization temperature of the amorphous semiconductor layer of the channel lower portion. For the allowable temperature of the device in the layer under the TFT of the first consideration, for example, in the case where a CMOS circuit exists in the lower layer, the allowable temperature is determined by the allowable temperatures of the gate stack, the junction structures (the p-n junctions and the silicide structures), the interconnect layers, etc., of the CMOS. The process upper limit temperature for all of the processes when forming the TFT is, for example, about 700° C. in the case where Ni silicide is formed for the CMOS. If the interconnect layer of the CMOS includes Cu, the temperature is about 450° C.

It is also necessary to consider the allowable temperature when a device other than a CMOS circuit exists in a layer under the TFT. For example, if memory such as ReRAM or the like that includes a metal oxide, etc., also is included, the allowable temperature of the metal oxide (e.g., about 600° C. for $HfO_2$ ReRAM) is the process upper limit temperature.

For example, in the case where the polycrystalline semiconductor material includes Si, the recrystallization temperature of the amorphous layer of the second consideration is set to be, for example, a temperature of 600° C. or less. However, the crystallization temperature fluctuates according to the ion species of the ion implantation. This temperature is the upper limit temperature of the processes after the amorphization by the oblique ion implantation. Therefore, here, this temperature is the upper limit temperature of only the gate stack formation process of the TFT and subsequent processes.

Second embodiment

FIG. 13A, FIG. 13B, FIG. 14A, FIG. 14B, FIG. 15A, FIG. 15B, FIG. 16A, FIG. 16B, FIG. 17A, and FIG. 17B are schematic views in order of the processes, showing a method for manufacturing a semiconductor device according to a second embodiment.

FIG. 13A to FIG. 17A are schematic cross-sectional views in order of the processes, showing the method for manufacturing the semiconductor device.

FIG. 13B to FIG. 17B are schematic top views in order of the processes, showing the method for manufacturing the semiconductor device.

In the embodiment, the polycrystalline semiconductor layer 10b is formed by causing the MILC to progress to the amorphous semiconductor layer 10a from a metal region 63a and the interconnect 62a of the CMOS circuit formed in the substrate 70 without using the interconnect 62e and the metal region 63e used in the first embodiment.

The semiconductor device 111 includes the metal region 63a and the interconnect 62a. The metal region 63a includes the first metal element (here, Ni). The metal region 63a is stacked with at least a portion of the second semiconductor region r2 in the Z-axis direction. The interconnect 62a is electrically connected to the metal region 63a and electrically connected to the second semiconductor layer 20. The metal region 63a is provided between the second semiconductor region r2 and the interconnect 62a. That is, the metal region 63a is provided as one body with the interconnect 62a.

In the embodiment, compared to the first embodiment, the parasitic resistance and/or parasitic capacitance may increase because the CMOS interconnect layer is utilized. However, there are cost benefits because processes such as additional lithography, etc., are omissible. The processes of the embodiment are substantially similar to those described in the first embodiment. The embodiment differs from the first embodiment in that the lower surface of the amorphous semiconductor layer 10a is connected to the metal region 63a provided as one body with the CMOS interconnect layer.

Figure 13A:
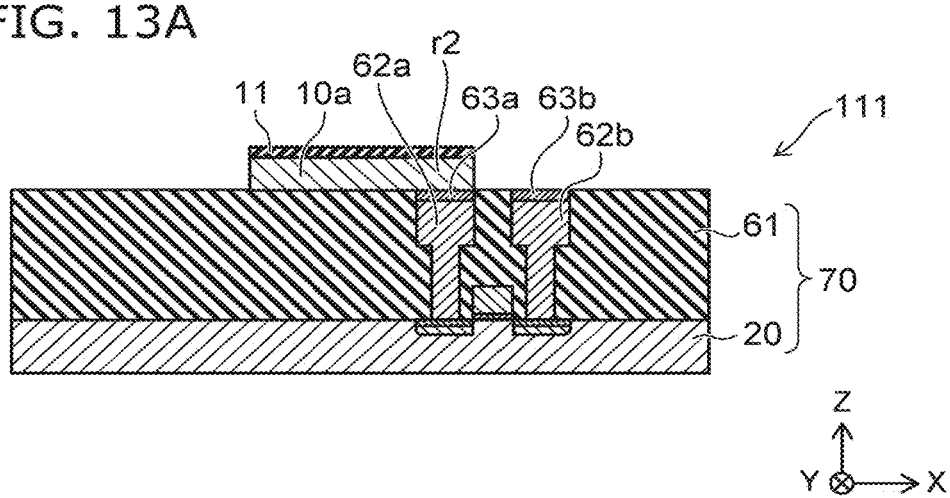
FIG. 13A and FIG. 13B are schematic views in order of the processes, showing a method for manufacturing a semiconductor device according to a second embodiment.
Figure 13B:
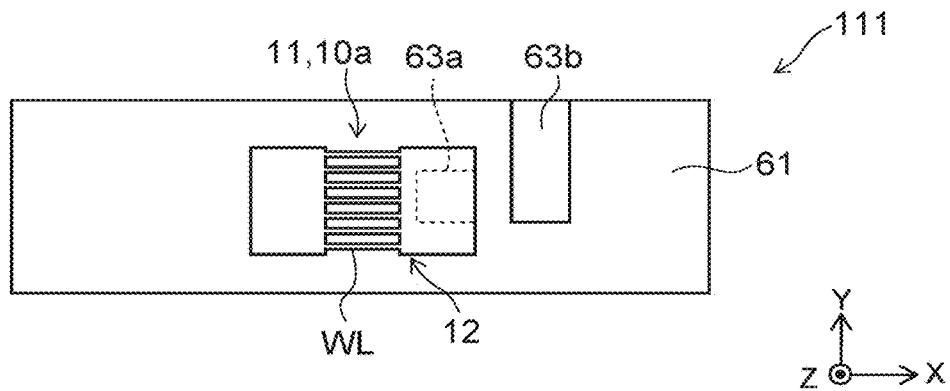

As shown in FIG. 13A and FIG. 13B, the substrate 70 in which the CMOS circuit is formed is prepared. At this time, the material of the metal region 63a and the material of the interconnect 62a may be the same for process simplification. In such a case, the metal region 63a may not be provided separately.

In the case where the amorphization process by ion implantation is not used, the hard mask layer 11 may not be formed. It is favorable to set the contact surface area between the amorphous semiconductor layer 10a and the metal region 63a to be as large as possible. Thereby, the contact resistance can be reduced.

A structure such as that shown in FIG. 13A and FIG. 13B is obtained by patterning the active region 12 into a wire configuration. The crystallization by MILC, the channel lower portion amorphization by oblique ion implantation, the formation of the gate stack structure, and the self-aligning formation of the structure of the silicide layer are similar to those of the first embodiment.

Figure 14A:
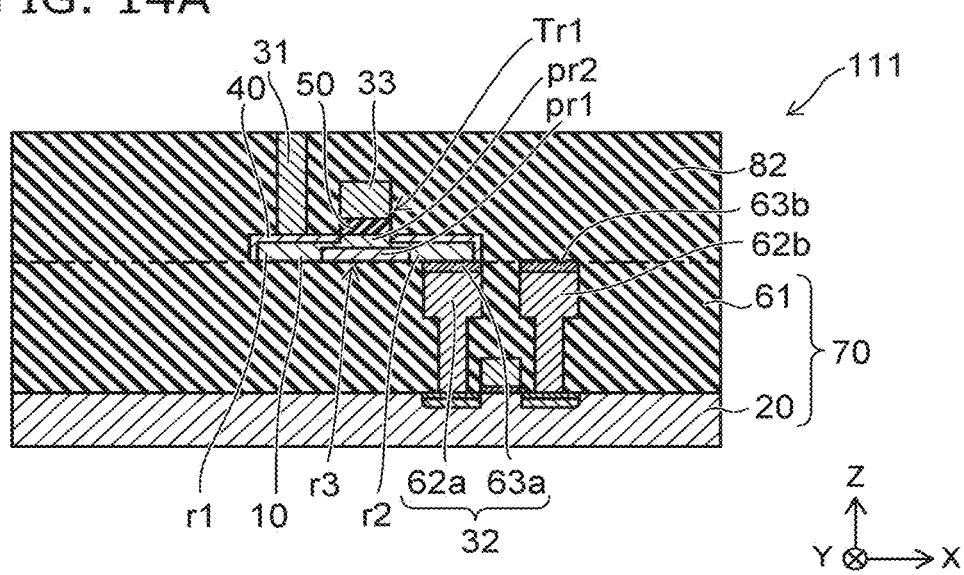
FIG. 14A and FIG. 14B are schematic views in order of the processes, showing a method for manufacturing a semiconductor device according to a second embodiment.
Figure 14B:
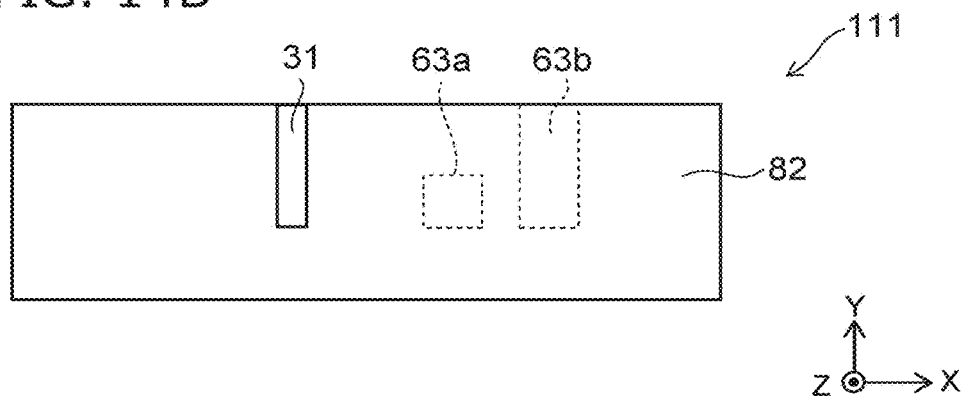

As shown in FIG. 14A and FIG. 14B, after the formation of the second insulating layer 82, the interconnects are formed after planarizing by CMP processing. Thereby, the semiconductor device 111 is obtained. In the example of FIG. 14A and FIG. 14B, an electrode is connected to the lower surface of one of the first semiconductor region r1 (the source region) or the second semiconductor region r2 (the drain region); and an electrode is connected to the upper surface of the other of the first semiconductor region r1 (the source region) or the second semiconductor region r2 (the drain region). The structure is asymmetric with respect to the gate.

Figure 15A:
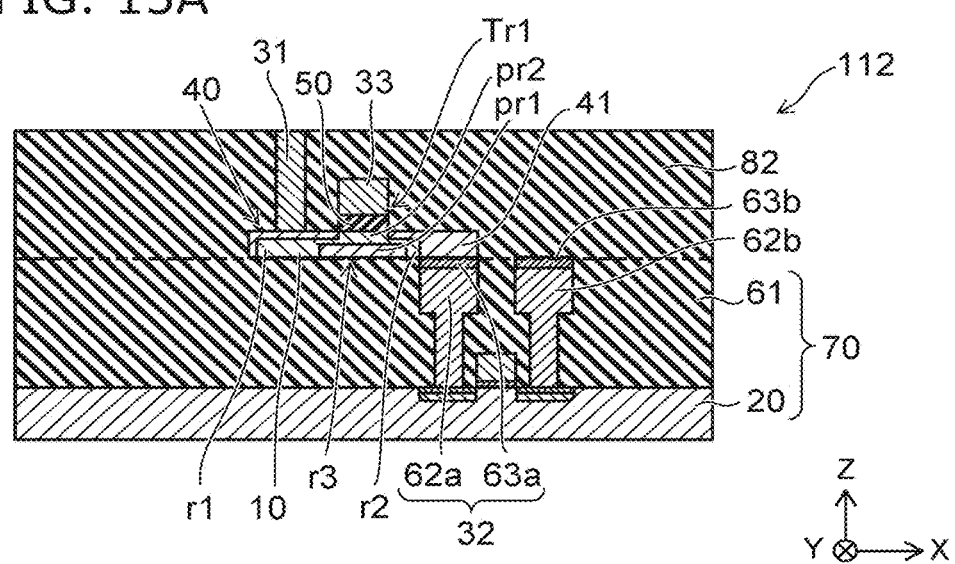
FIG. 15A and FIG. 15B are schematic views in order of the processes, showing a method for manufacturing a semiconductor device according to a second embodiment.
Figure 15B:
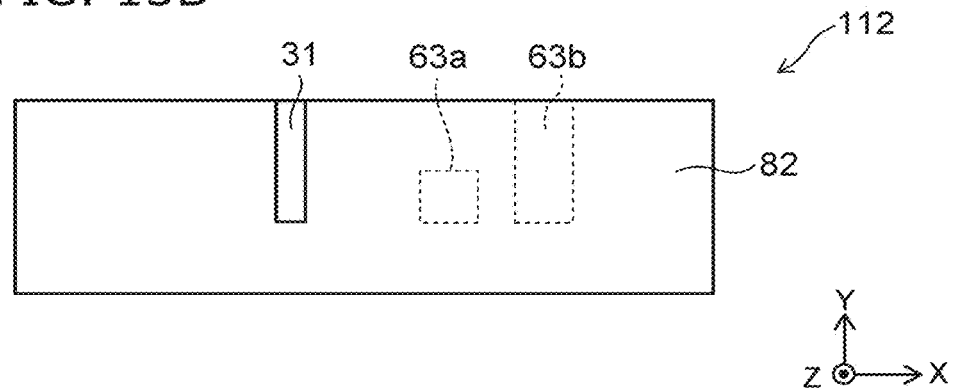

It is considered that it may be difficult to reduce the contact resistance in the case where a contact is made from the lower surface of the first semiconductor layer 10. Therefore, as shown in FIG. 15A and FIG. 15B, one of the source region or the drain region on the lower surface connection unit side of the first semiconductor layer 10 may be fully silicided. In the example, the second semiconductor region r2 (the drain region) is a fully-silicided region 41. The fully-silicided region 41 includes, for example, NiSi. Thereby, the semiconductor device 112 is obtained.

When fully siliciding, it is necessary to suppress the increase of GIDL (Gate-Induced-Drain-Leakage current) by setting the silicide layer 40 to overlap the gate end portion. To this end, it is desirable to set the side wall of the gate to be sufficiently thick. For example, in the case where the thickness of the first semiconductor layer 10 (the poly-Si layer) is 50 nm, it is desirable to set the thickness of the Ni to be about 50 nm when forming the NiSi of the silicide layer 40. Thereby, the sheet resistance can be reduced. It is necessary to form the side wall of the gate to be thick enough that the parasitic resistance does not become large and the GIDL does not increase; and it is desirable to be, for example, not less than 20 nm and not more than 50 nm.

Figure 16A:
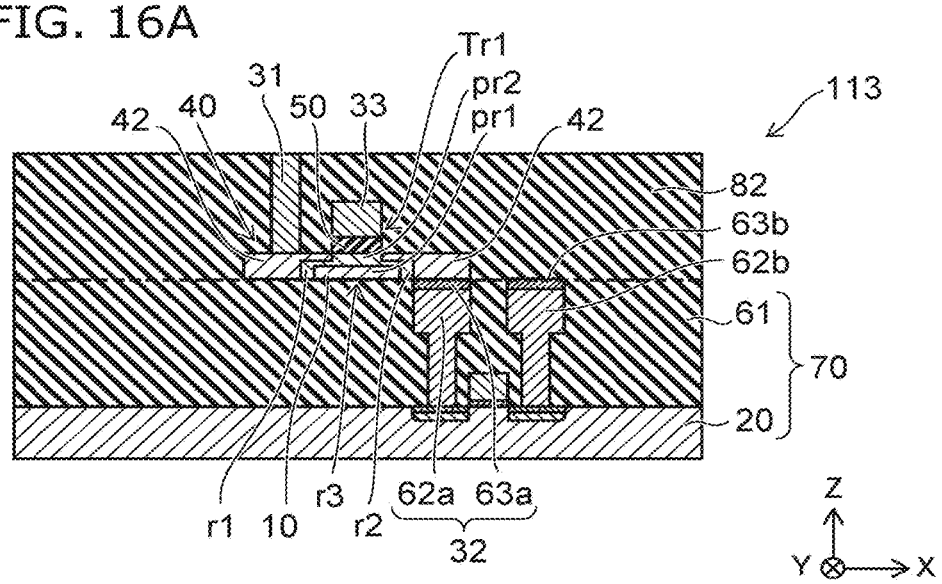
FIG. 16A and FIG. 16B are schematic views in order of the processes, showing a method for manufacturing a semiconductor device according to a second embodiment.
Figure 16B:
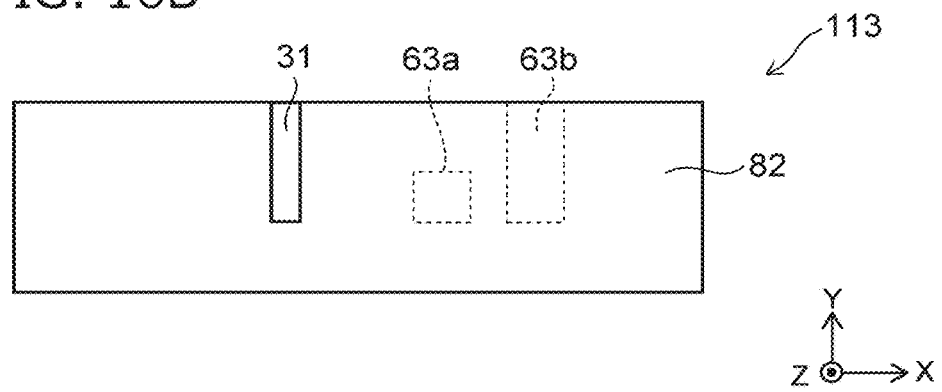

As shown in FIG. 16A and FIG. 16B, both the source region and the drain region on the lower surface connection unit side of the first semiconductor layer 10 may be fully silicided. In the example, the first semiconductor region r1 (the source region) and the second semiconductor region r2 (the drain region) each are a fully-silicided region 42. Thereby, the process can be simple compared to the process of fully siliciding only the side where the contact is made at the lower interconnect. Thereby, the semiconductor device 113 is obtained.

Figure 17A:
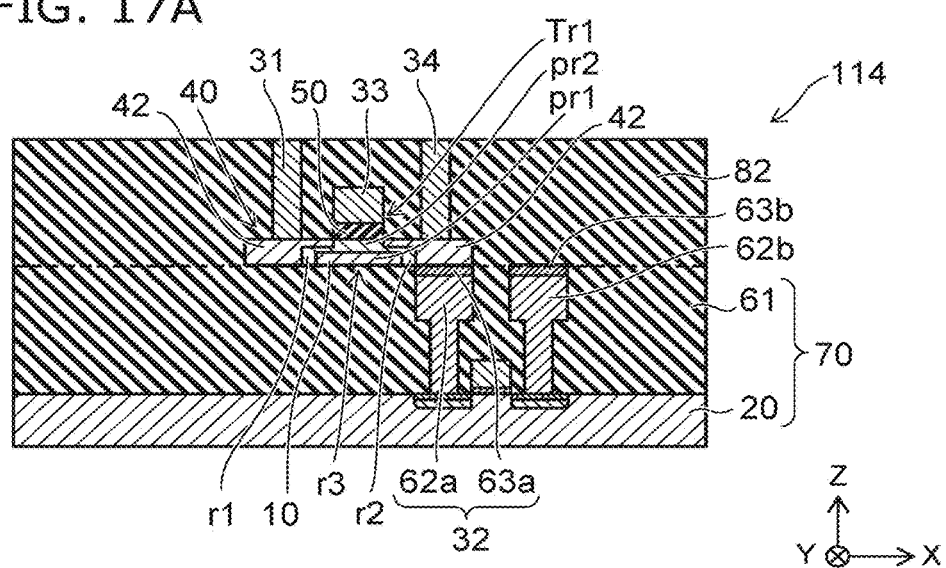
FIG. 17A and FIG. 17B are schematic views in order of the processes, showing a method for manufacturing a semiconductor device according to a second embodiment.
Figure 17B:
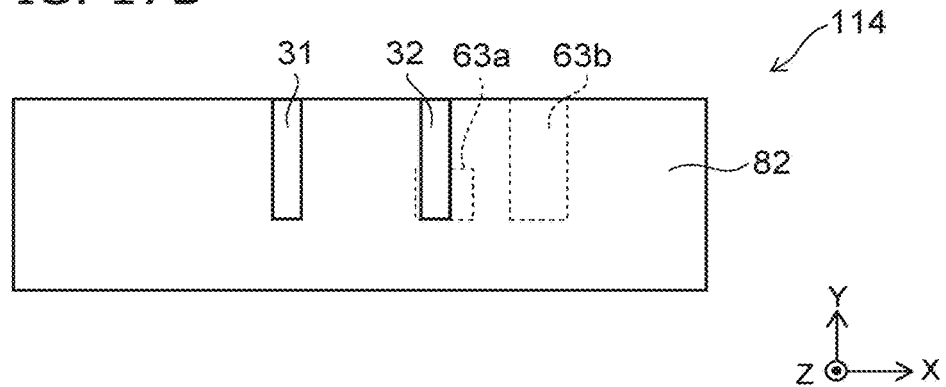

As shown in FIG. 17A and FIG. 17B, in the case where a circuit requiring the same potential as the lower surface of the first semiconductor layer 10 is formed, a conductor may be formed at the upper surface in addition to the conductor of the lower surface. In the example, the second conductor 32 is connected to the lower surface of the second semiconductor region r2 (the drain region); and a fourth conductor 34 is connected to the upper surface of the second semiconductor region r2 (the drain region). For example, a position of a portion of the second semiconductor region r2 in the second direction is between a position of the second conductor 32 in the second direction and a position of the fourth conductor 34 in the second direction. The process upper limit temperature of the embodiment also is used as a reference similar to that of the first embodiment. Thereby, the semiconductor device 114 is obtained.

Thus, in the embodiment, a MILC process is implemented after patterning the channel region into a wire configuration by using, as a seed layer, the metal region provided as one body with the interconnects connected to the transistors inside the substrate. At this time, the entire polycrystalline semiconductor layer including the channel layer is crystallized from one of the source region or the drain region. Thereby, it is possible to form a polycrystalline semiconductor layer having high mobility and good crystallinity. Only the channel lower portion region is amorphized by using an oblique ion implantation process, etc. Thereby, the conduction due to the residual metal existing in the channel lower portion region is suppressed; and it is possible to suppress the leakage current.

According to the embodiments, a semiconductor device in which the leakage current is suppressible can be provided.

Hereinabove, embodiments of the invention are described with reference to specific examples. However, the invention is not limited to these specific examples. For example, one skilled in the art may similarly practice the invention by appropriately selecting specific configurations of components such as the first semiconductor region, the second semiconductor region, the third semiconductor region, the first conductor, the second conductor, the third conductor, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A semiconductor device, comprising:
a first semiconductor region;
a second semiconductor region separated from the first semiconductor region in a first direction;
a third semiconductor region between the first semiconductor region and the second semiconductor region;
a first conductor electrically connected to the first semiconductor region;
a second conductor electrically connected to the second semiconductor region; and
a third conductor separated from the third semiconductor region in a second direction intersecting the first direction,
the third semiconductor region including
a first partial region including a first metal element, the first partial region being amorphous, and
a second partial region stacked with the first partial region in the second direction, the second partial region being polycrystalline,
a first concentration of the first metal element in the first partial region being higher than a second concentration of the first metal element in the second partial region, or the second partial region not including the first metal element.

2. A semiconductor device, comprising:
a first semiconductor region;
a second semiconductor region separated from the first semiconductor region in a first direction;
a third semiconductor region between the first semiconductor region and the second semiconductor region;
a first conductor electrically connected to the first semiconductor region;
a second conductor electrically connected to the second semiconductor region; and
a third conductor separated from the third semiconductor region in a second direction intersecting the first direction,
the third semiconductor region including
a first partial region including a first metal element, the first partial region being amorphous,
a second partial region stacked with the first partial region in the second direction, the second partial region being polycrystalline, and
a third partial region provided between the first partial region and the second partial region,
a first concentration of the first metal element in the first partial region being higher than a second concentration of the first metal element in the second partial region, or the second partial region not including the first metal element,
a third concentration of the first metal element in the third partial region is between the first concentration and the second concentration.

3. The device according to claim 1, wherein the second partial region is provided between the first partial region and the third conductor.

4. The device according to claim 2, wherein
the first semiconductor region includes a polycrystal of at least one of silicon or germanium,
the second semiconductor region includes a polycrystal of at least one of silicon or germanium, and
the third semiconductor region includes at least one of silicon or germanium.

5. A semiconductor device, comprising:
a first semiconductor region;
a second semiconductor region separated from the first semiconductor region in a first direction;
a third semiconductor region between the first semiconductor region and the second semiconductor region;
a first conductor electrically connected to the first semiconductor region;
a second conductor electrically connected to the second semiconductor region;
a third conductor separated from the third semiconductor region in a second direction intersecting the first direction;
a semiconductor layer; and
a first insulating layer including a first portion and a second portion,
the third semiconductor region including
a first partial region including a first metal element, the first partial region being amorphous, and
a second partial region stacked with the first partial region in the second direction, the second partial region being polycrystalline,
a first concentration of the first metal element in the first partial region being higher than a second concentration of the first metal element in the second partial region, or the second partial region not including the first metal element,
the third semiconductor region being disposed between the third conductor and the semiconductor layer in the second direction,
the first portion of the first insulating layer being disposed between the first semiconductor region and a portion of the semiconductor layer,
the second portion of the first insulating layer being disposed between the third semiconductor region and a portion of the semiconductor layer.

6. The device according to claim 5, wherein the second conductor is disposed between the second semiconductor region and the semiconductor layer and electrically connected to the semiconductor layer.

7. The device according to claim 5, wherein the first semiconductor region is disposed between the first conductor and the first insulating layer.

8. The device according to claim 5, further comprising:
a region including the first metal element; and
an interconnect,
the region including the first metal element being stacked with at least a portion of the second semiconductor region in the second direction, the region including the first metal element being disposed between the second semiconductor region and the semiconductor layer,
at least a portion of the interconnect being disposed between the region including the first metal element and the semiconductor layer and electrically connected to the region including the first metal element,
the first insulating layer including a third portion,
the third portion being disposed between the semiconductor layer and the interconnect.

9. The device according to claim 5, further comprising:
a region including the first metal element; and
an interconnect,
the region including the first metal element being stacked with at least a portion of the second semiconductor region in the second direction,
the interconnect being electrically connected to the semiconductor layer and electrically connected to the region including the first metal element.

10. The device according to claim 2, wherein the first metal element includes at least one selected from the group consisting of tungsten, cobalt, titanium, nickel, palladium, platinum, aluminum, and copper.

11. The device according to claim 5, wherein the first insulating layer includes at least one selected from the group consisting of silicon oxide, silicon nitride, and silicon oxynitride.

12. The device according to claim 8, wherein the interconnect includes at least one selected from the group consisting of tungsten, aluminum, and copper.

13. The device according to claim 8, wherein the at least a portion of the second semiconductor region is disposed between the region including the first metal element and the second conductor.

14. A semiconductor device, comprising:
a first semiconductor region;
a second semiconductor region separated from the first semiconductor region in a first direction;
a third semiconductor region between the first semiconductor region and the second semiconductor region;
a first conductor electrically connected to the first semiconductor region;
a second conductor electrically connected to the second semiconductor region;

a third conductor separated from the third semiconductor region in a second direction intersecting the first direction; and
a fourth conductor electrically connected to the second semiconductor region,
the third semiconductor region including
　a first partial region including a first metal element, the first partial region being amorphous, and
　a second partial region stacked with the first partial region in the second direction, the second partial region being polycrystalline,
a first concentration of the first metal element in the first partial region being higher than a second concentration of the first metal element in the second partial region, or the second partial region not including the first metal element,
a position of a least a portion of the second semiconductor region in the second direction being between a position of the second conductor in the second direction and a position of the fourth conductor in the second direction.

15. The device according to claim 2, further comprising an insulating layer,
　the third conductor being disposed between the third semiconductor region and the insulating layer.

16. The device according to claim 4, wherein the third semiconductor region further includes at least one of argon, neon, carbon, or fluorine.

17. The device according to claim 2, wherein the second semiconductor region includes nickel and silicon.

18. The device according to claim 2, wherein
　the third semiconductor region includes a plurality of structure portions, and
　the plurality of structure portions are separated from each other in a third direction intersecting the first direction and intersecting the second direction.

* * * * *